United States Patent [19]
Cordini et al.

[11] Patent Number: 5,565,806
[45] Date of Patent: Oct. 15, 1996

[54] INPUT/OUTPUT INTERFACE CIRCUIT FOR DIGITAL AND/OR ANALOG SIGNALS

[75] Inventors: Paolo Cordini; Giorgio Pedrazzini, both of Pavia; Domenico Rossi, Cilavegna, all of Italy

[73] Assignee: SGS-Thomson Microelectronics, S.r.L., Italy

[21] Appl. No.: 262,590

[22] Filed: Jun. 20, 1994

[30] Foreign Application Priority Data

Oct. 29, 1993 [EP] European Pat. Off. ............... 93830436

[51] Int. Cl.⁶ ........................................................ H03B 1/00
[52] U.S. Cl. ............................ 327/108; 327/319; 327/333
[58] Field of Search .......................... 326/62–81; 327/108, 327/112, 319, 333

[56] References Cited

U.S. PATENT DOCUMENTS

| | | | |
|---|---|---|---|
| 3,816,765 | 6/1974 | Goyer | 326/75 |
| 4,749,882 | 6/1988 | Morgan | 327/108 |
| 4,920,284 | 4/1990 | Denda | 326/68 |
| 5,146,109 | 9/1992 | Martigononi | 327/108 |
| 5,153,462 | 10/1992 | Agrawal et al. | 307/465 |

FOREIGN PATENT DOCUMENTS

| | | | |
|---|---|---|---|
| 0380456 | 8/1990 | European Pat. Off. | G05B 19/04 |
| WO92/17830 | 10/1992 | WIPO | G05B 19/05 |

*Primary Examiner*—Timothy P. Callahan
*Assistant Examiner*—Jeffrey Zweizig
*Attorney, Agent, or Firm*—Felsman, Bradley, Gunter & Dillon, LLP

[57] ABSTRACT

The present invention relates to an integrated input/output interface for low and/or high voltage range signals of the digital and/or analog type. It comprises essentially a power amplification circuit block (2) having at least one low voltage range input terminal (A) and at least one high voltage range output terminal (B), and a second amplification circuit block (3) having a high voltage range input terminal connected to said high voltage range output terminal (B) and at least one low voltage range output terminal (D). A conventional circuit block (4) prevents a high voltage range signal being input to said high voltage range terminal (B) from propagating through the first power amplification circuit block (2), so that it only affects the second amplification circuit block (3). This interface is implemented in mixed high voltage bipolar/CMOS/DMOS technology.

26 Claims, 2 Drawing Sheets

5,565,806

INPUT/OUTPUT INTERFACE CIRCUIT FOR DIGITAL AND/OR ANALOG SIGNALS

DESCRIPTION

1. Field of the Invention

This invention relates to an integrated input/output interface circuit for low and/or high voltage signals of the digital and/or analog type.

2. Prior Art

As well known, it is often necessary to interface devices which operate with widely different voltages.

A typical example of that requirement can be found in the field of industrial control systems where an intelligent unit, typically a microcontroller, is employed to process input information and output electric signals for driving different types of actuators. The input information may be either very small analog signals, from sensors arranged to monitor a process to be controlled, or digital signals.

The microcontroller normally operates at a much lower voltage than the operating voltage of the actuator, and accordingly, the microcontroller output would be uncapable to drive the actuator directly. Thus, appropriate interface circuits, effective to provide electric and functional links between such devices, are required.

The interface circuits which have been proposed, as employed in similar or comparable situations to that just outlined, exhibit a low degree of applicational flexibility. In fact, they can admit of but a narrow range of variability in the amplitude of the signals (voltages or currents) which may be input thereto.

Moreover, the range of variability of the signals to be obtained at the output in said prior art circuits is also limited.

In other words, prior art interface circuits can only be input low voltage (hence, low power) signals to output high voltage signals, or high voltage (high power) signals to output low voltage signals. Besides, they operate within a fairly narrow range of variability of the values involved.

One purpose of the present invention is to provide an input/output interface circuit, of a type integrated into a semiconductor, which can operate with both low and high voltage input signals to correspondingly output high or low voltage signals.

Another object of the invention is to provide an interface circuit which can drive loads requiring operating voltages or power levels which may vary within a very broad range.

A further object of the present invention is that the interface circuit can handle analog signals of small amplitude as well as digital signals that may have high voltages.

SUMMARY OF THE INVENTION

The present invention relates to an integrated input/output interface circuit for low and/or high voltage range signals of the digital and/or analog type. It comprises essentially a first power amplification circuit block having at least one low voltage range input terminal and at least one high voltage range output terminal, and a second amplification circuit block having a high voltage range input terminal connected to said high voltage range output terminal and at least one low voltage range output terminal. Moreover, a conventional circuit block prevents a high voltage range signal being input to said high voltage range input terminal from propagating through the first block, so that it only affects the second block. This interface circuit is implemented in high voltage mixed bipolar/MOS technology.

The features and advantages of an interface circuit according to the invention will be apparent from the following description of an embodiment thereof, given by way of example and not of limitation with reference to the accompanying drawings.

DETAILED DESCRIPTION

Figure 1:
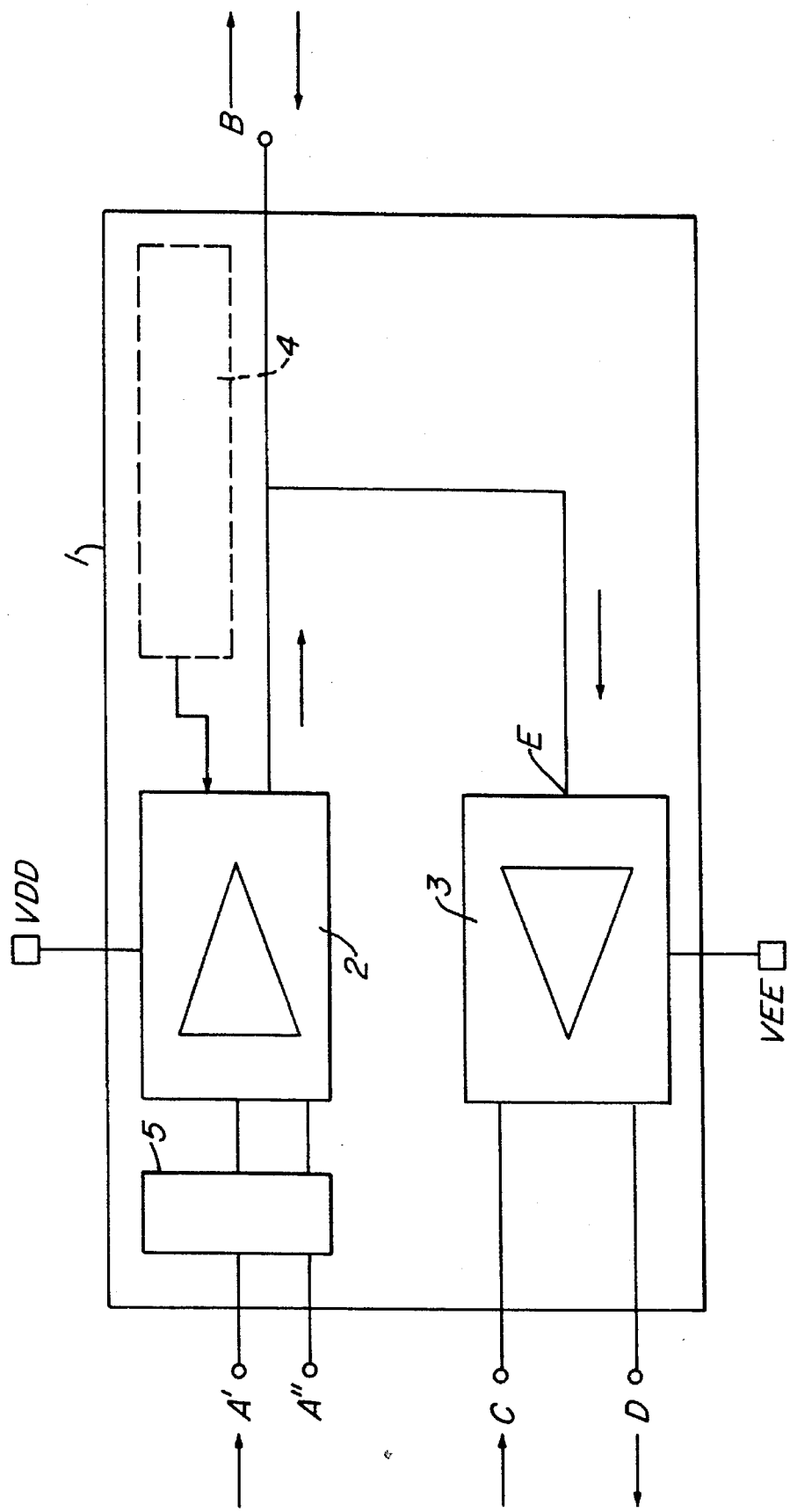
FIG. 1 is a block diagram of an interface circuit according to the invention.

With reference to FIG. 1, schematically shown as 1 is an entire interface circuit according to the invention.

In FIG. 1 the main circuit blocks which are included in the interface circuit 1 are also shown. The number of these main circuit blocks may narrow down to the following two:

- a first power amplification circuit block 2 connected to a high voltage supply terminal VDD and having at least a first, low voltage input terminal A', eventually (as shown in FIG. 1) a second input terminal A", and at least one high voltage output terminal B; and
- a second amplification circuit block 3, being implemented with active power components, connected to a low voltage supply terminal VEE and having a first, high voltage, input terminal E connected to the output terminal B of the first block 2, a second, low voltage, input C, and at least one low voltage output terminal D.

Also shown in phantom lines in FIG. 1 is a cutoff circuit block 4, intended for inhibiting conduction of the circuit block 2 when the output terminal B is operating as an input. In this way, any high voltage signals applied to B would only affect the circuit block 3. The internal construction of the cutoff block 4 is known per se.

On the other hand, the circuit block 3 being comprised of power elements which can operate with high voltages, it can be "tolerant" of high voltage inputs, to (eventually) output low voltage signals.

In relation to the application of the interface circuit of FIG. 1 to industrial control systems, the high voltage circuit block 2 would operate in association with the actuator, while the low voltage circuit block 3 would operate in association with the microcontroller. The circuit block 2 may be supplied directly from the same source as the actuator, and the circuit block 3 may share the low voltage supply with the microcontroller.

The implementation of both low voltage parts and high voltage (or large current parts) in the same semiconductor integrated circuit is made possible by the availability of a mixed high voltage technology. Specifically, recourse is had to a mixed bipolar/CMOS/DMOS CBCD") technology, which allows integrated active components of the bipolar, CMOS, or DMOS types to be provided.

Figure 2:
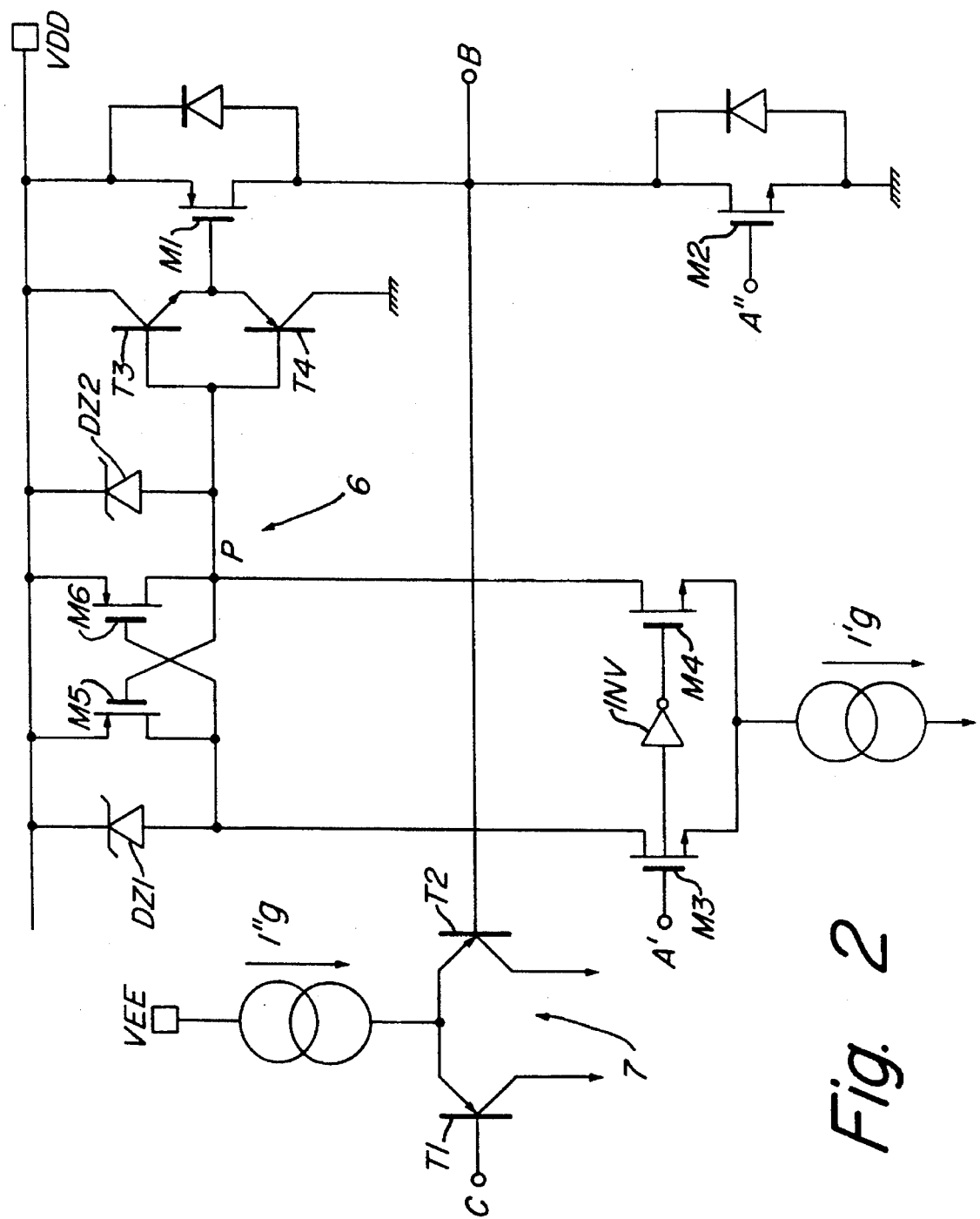
FIG. 2 shows a possible circuit embodiment of the block diagram of FIG. 1.

FIG. 2 shows a preferred embodiment in BCD technology of the interface circuit depicted schematically in FIG. 1.

The circuit block 2 of FIG. 1 includes in FIG. 2 an output stage of the push/pull type which can drive loads requiring both high and low voltages. This output stage comprises a P-channel MOS transistor M1 whose source terminal is connected to the high voltage supply terminal VDD, and a DMOS transistor M2 having its source terminal connected to a ground terminal.

A circuit portion 6 (also to be considered as included into the circuit block 2 of FIG. 1) drives the transistor MI. Said circuit portion 6 comprises a pair of low power MOS transistors M3 and M4, an inverter INV, a pair of MOS transistors M5 and M6, a pair of Zener diodes DZ1 and DZ2, and a pair of bipolar transistors T3 and T4.

The signals for driving the transistor M1 are low voltage signals which are applied to the gate terminal of the transistor M3. The gate terminal of M3 forms the first low voltage input A' of the interface 1.

The transistors M3 and M4 have their respective gate terminals connected together through the inverter INV. Furthermore, their source terminals are also connected together, as well as to ground, via a current generator I'g. The MOS transistors M5 and M6 are cross-coupled, with their source terminals connected to the supply terminal VDD and their drain terminals connected to the anodes of the diodes DZ2 and DZ1, respectively. Said diodes DZ2 and DZ1 have a Zener voltage adequate to respectively turn M5 and M6 on. The bipolar transistors T3 and T4 are coupled through their respective emitter and base terminals, with the collector of T3 being connected to the voltage VDD, the collector of T4 connected to ground, the common emitter connected to the gate terminal of M1, and the common base connected to the anode of DZ2, that is to the drain terminal of the transistor M6.

The transistors M5 and M6 are cross-coupled to provide a positive feedback that will quicken the upward and downward sloping edges of variation of the potential at the node P (common base of the bipolar transistors T3 and T4).

The operation of the driver circuit 6 will now be described.

When the low voltage signal applied to the input terminal A' of the interface, that is to the gate of the transistor M3, has such an amplitude as to turn on the transistor M3, the other transistor M4 will be cut off because its gate terminal is connected to the input A' through the inverter INV. With M3 in the on state, the current from the generator I'g is allowed to flow through the diode DZ1, which will be operating in reverse conduction. Thus, its Zener voltage will be applied between the source and the gate of the transistor M6, thereby turning the later on. The transistor M6, in turn, will turn on the bipolar T3 to drive the output power transistor M1 off.

Conversely, when the amplitude of the signal applied to the terminal A' is insufficient to turn on the transistor M3, the other transistor M4 will be turned on, and the diode DZ2 will conduct the current from the generator I'g in the reverse direction. The Zener voltage of DZ2 will turn on the second bipolar T4, and through the latter, M1 as well.

The DMOS transistor M2, by having its source connected to ground, requires no drive circuit, like that described for MI. M2 will be driven directly by the signal received on its gate terminal, that is the second low voltage input A" of the interface 1. Therefore, this signal can turn the transistor M2 on or off, according to its amplitude.

A second circuit portion 7 of the interface circuit, constituting the practical implementation of the circuit block 3 of FIG. 1, comprises two bipolar transistors T1 and T2 of the pnp type, which are coupled through their respective emitters. These transistors are for high voltages. Moreover, the circuit 7 includes a current generator I" g connected between the emitters of the transistors T1 and T2 and the low voltage supply VEE.

The base of T2 is connected to the drain terminals of both transistors M1 and M2. This terminal constitutes the input/ output terminal B for high voltage signals, shown also in FIG. 1. Accordingly, the base of T2 will be applied high voltage signals, and since T2 is a transistor for high voltages, its emitter-base junction can comfortably accommodate the large potential difference which develops across it.

The configuration adopted to implement the circuit block 3 is highly flexible in use. That block may actually be used in an analog manner both as operational amplifier and differential amplifier, where a low voltage signal is applied to the base of T1 which forms the other low voltage input C of the interface 1.

The block 3 may also function as a comparator, in particular a digital comparator. Assuming a constant voltage of 2.5 volts applied to the base of T1 and a low supply voltage VEE of 5 volts, the T1-T2 pair can convert a signal applied to the terminal B (i.e., to the base of T2) to an output signal on the collector of T1. The signal applied to B may be as high as 60 volts, and the correspondent output of 0.5 volt, that is a standard signal in the instance of CMOS circuits. The collector of T1 constitutes, therefore, a low voltage output D of the entire interface.

As for the cutoff circuit block 4, its construction does not appear in detail on the drawing because it is conventional. It is effective for inhibiting both transistors M1 and M2 from conducting upon a high voltage signal being applied to the high voltage input/output terminal B, so that this signal will only be conveyed to the base of T2. The push/pull stage would, therefore, operate as a "tristate", since both M1 and M2 MOS transistors are driven in either by an enable signal from said circuit block 4 as well as by the driver circuit just described and by the second input signal respectively.

The interface 1 may be provided with a further control circuit (5 (shown in FIG. 1) for the push/pull stage M1-M2, operative to ensure that only one of said MOS power transistors (M1 or M2) would be conducting at any one time. This prevents a large current from flowing between the supply terminal VDD and ground.

The implementation of the two last-mentioned circuits is well known and presents no difficulties for those skilled in the art.

Modifications and variations of the described interface circuit can be made in conformity with the scope of the present invention as set forth in the annexed claims.

What is claimed is:

1. An integrated input/output interface circuit for low and/or high voltage signals of the digital and/or analog type, comprising:

a first power amplification circuit block, connected to a high voltage supply terminal, and having a low voltage input terminal and a high voltage output terminal; and a second amplification circuit block, including active power components, connected to a low voltage supply terminal, and having a high voltage input terminal connected to said high voltage output terminal of said first power amplification circuit block, a low voltage input terminal, and a low voltage output terminal.

2. An interface circuit according to claim 1, wherein said first and second amplification circuit blocks are implemented in BCD technology.

3. An interface circuit according to claim 2, wherein said first power amplification circuit block includes:

a push/pull output stage consisting of a power MOS transistor and a DMOS transistor connected through their respective drain terminals to said high voltage output terminal, the source terminal of said power MOS transistor being connected to said high voltage supply terminal and the source terminal of said DMOS transistor being connected to a ground terminal; and a driver circuit for driving said power MOS transistor and connected between said low voltage input terminal of said first power amplification circuit block and the gate terminal of said power MOS transistor.

4. An interface circuit according to claim 3, wherein said driver circuit for driving said power MOS transistor includes:

first and second low power MOS transistors coupled together through their respective source terminals, connected to ground through a current generator, the gate terminal of said first low power MOS transistors being connected to said low input terminal of said first power amplification circuit block and to the gate terminal of said second low power MOS transistors through an inverter;

first and second Zener diodes having respective cathodes connected both to said high voltage supply terminal and respective anodes connected to the drain terminals of said first and second low power MOS transistors respectively;

third and fourth MOS transistors having respective source terminals connected both to said high voltage supply terminal, the gate terminal of said third and fourth MOS transistors being connected to the drain terminal of said second and first low power MOS transistors respectively; the drain terminal of said third MOS transistor being connected to the anode of said first Zener diode and the drain terminal of said fourth MOS transistor being connected to the anode of said second Zener diode; and a complementary symmetry pre-amplification stage, including a first bipolar transistor of the npn type and second bipolar transistor of the pnp type, the respective emitter terminals of said first and second bipolar transistors being connected together and to the gate terminal of said power MOS transistor, the respective base terminals of said first and second bipolar transistors being connected together and to the anode of said second Zener diode, the collector terminal of said first bipolar transistor being connected to said high voltage supply terminal, and the collector terminal of said second bipolar transistor being connected to said ground terminal.

5. An interface circuit according to claim 2, wherein said second amplification circuit block includes third and fourth bipolar transistors for high voltage applications which are coupled together through their respective emitter terminals and to said low voltage supply terminal through a current generator; the base terminal of said third bipolar transistor being connected to said low voltage input of said second amplification circuit block; the base terminal of said fourth bipolar transistor being connected to said high voltage input terminal; and the collector terminal of either said third or fourth bipolar transistors being said low voltage output terminal.

6. An interface circuit, comprising:

a first amplification block, connected to receive a low voltage range input signal at a low input terminal thereof and to provide a high voltage range output signal at a high input/output terminal, said first amplification block being powered at a high voltage supply terminal; and a second amplification block, connected to receive a high voltage range input signal at said high input/output terminal and to provide a low voltage range output signal at a low output terminal thereof, said second amplification block being powered at a low voltage supply terminal.

7. An interface circuit according to claim 6, wherein said second amplification block is further connected to a low input terminal thereof to receive a further low voltage range input signal.

8. An interface circuit according to claim 7, wherein said second amplification block includes:

a first bipolar transistor connected to be controlled by said further low voltage range input signal of said second amplification block;

a second high voltage bipolar transistor connected to be controlled by said high voltage range input signal;

said first and second bipolar transistors being both supplied by said low voltage supply terminal, and either said first or said second bipolar transistors providing said low voltage range output signal.

9. An interface circuit according to claim 6, wherein said first amplification block includes:

an output push/pull stage including first and second power field effect transistors, connected in series between respectively said high voltage supply terminal and a ground terminal, the drain terminals thereof being both connected to said high input/output terminal to provide said high voltage range output signal; and a driver circuit for said first power field effect transistor, connected to be controlled by said low voltage range input signal of said first amplification block and to couple said first power field effect transistor to said low input terminal of said first amplification block, such as to turn on and off said first power field effect transistor depending on the value of said low voltage range input signal.

10. An interface circuit according to claim 9, wherein said driver circuit, to turn said first power field effect transistor off, connects the gate thereof to said high voltage supply terminal.

11. An interface circuit according to claim 9, wherein said driver circuit includes:

first and second field effect transistors, connected to be controlled by said low voltage range input signal, respectively directly and trough an inverter, said first and second field effect transistor being coupled to said ground terminal;

first and second zener diodes, connected respectively to said first and second field effect transistors and both to said high supply terminal, to operate in reverse conduction when respectively said first and second field effect transistor are turned on;

third and fourth cross coupled field effect transistors, connected in parallel with said first and second zener diodes, to be turned on when respectively said second and first zener diodes operate in reverse conduction, said third and fourth field effect transistors being powered by said high supply terminal; and first and second complementary bipolar transistors in series respectively between said high voltage supply terminal and said ground terminal, connected to be both controlled by said fourth field effect transistor and by said second zener diode, and to turn on or off said first power field effect transistor by connecting the gate terminal thereof to said ground terminal or to said high voltage supply terminal respectively and according to the turn on of said second zener diode or of said fourth field effect transistor.

12. An interface circuit according to claim 9, wherein said high voltage range output signal is provided by one of said first and second power field effect transistors at one time.

13. An interface circuit according to claim 6, wherein said second amplification block includes active power components.

14. An interface circuit according to claim 6, wherein said first amplification block is connected to an additional low input terminal thereof.

15. An interface circuit according to claim 6, further comprising a cutoff circuit block, connected to inhibit the operation of said first amplification block when said high voltage range input signal is applied to said high input/output terminal.

16. An integrated interface circuit according to claim 6, wherein said first and second amplification blocks are implemented in BCD technology.

17. An integrated interface circuit, comprising:

an output push/pull stage including first and second power field effect transistors, connected in series between respectively a high voltage supply terminal and a ground terminal, the drain terminals thereof being both connected to a high input/output terminal to alternatively provide a high output voltage signal;

first and second field effect transistors, connected to be controlled by a first low input voltage signal, respectively directly and trough an inverter, said first and second field effect transistor being coupled to said ground terminal;

first and second zener diodes, connected respectively to said first and second field effect transistors and both to said high supply terminal, to operate in reverse conduction when respectively said first and second field effect transistor are turned on;

a third field effect transistor, connected to be turned on when said first zener diode operates in reverse conduction, and to be powered by said high supply terminal;

a complementary stage, including first and second complementary transistors in series respectively between said high voltage supply terminal and said ground terminal, connected to be both controlled by said third field effect transistor and by said second zener diodes, and to turn on or off alternatively said first power field effect transistor by connecting the gate terminal thereof to said ground terminal or to said high voltage supply terminal respectively and according to the turn on of said second zener diode or said third field effect transistor; and a differential stage connected to receive a high input voltage signal from said high input/output terminal and to provide a low output voltage signal at a low output terminal, said differential stage being supplied at a low voltage supply terminal;

wherein said second power field effect transistor is connected to be controlled by a second low input voltage signal.

18. An integrated interface circuit according to claim 17, further comprising an additional field effect transistor cross coupled with said third field effect transistor, connected to be turned on when said first zener diode operates in reverse conduction, and to be powered by said high supply terminal;

said additional and said third field effect transistors being connected and configured to quicken the transition between turning on and off, or viceversa, of said complementary stage through a control node thereof.

19. An integrated interface circuit according to claim 17, wherein said differential stage includes:

a first bipolar transistor connected to be controlled by an additional low input voltage signal;

a second high voltage bipolar transistor connected to be controlled by said high input voltage signal;

said first and second bipolar transistors being both supplied by said low voltage supply terminal, and either said first or said second bipolar transistors providing said low output voltage signal.

20. An integrated interface circuit according to claim 17, wherein said first and second power field effect transistors are respectively a p-channel MOS transistor and a n-channel DMOS transistor.

21. An integrated interface circuit according to claim 17, wherein said first and second field effect transistors are low power transistors.

22. An integrated interface circuit according to claim 17, wherein said first and second complementary transistor of said complementary stage are respectively npn and pnp bipolar transistors.

23. An integrated interface circuit according to claim 17, wherein said first and second low input voltage signals are equal.

24. An integrated interface circuit according to claim 17, wherein said field effect transistors are MOS transistors.

25. An integrated interface circuit according to claim 17, wherein the components thereof are manufactured in mixed BCD technology.

26. An integrated interface circuit according to claim 17, further comprising a cutoff circuit, connected to inhibit the operation of said first and second power field effect transistors when said high input voltage signal is applied to said high input/output terminal.

* * * * *